(12) United States Patent
Hayashi

(10) Patent No.: US 11,101,815 B2
(45) Date of Patent: Aug. 24, 2021

(54) ENCODER AND CONTROL SYSTEM

(71) Applicant: Fanuc Corporation, Yamanashi (JP)

(72) Inventor: Shinichirou Hayashi, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 114 days.

(21) Appl. No.: 16/579,203

(22) Filed: Sep. 23, 2019

(65) Prior Publication Data
US 2020/0099387 A1    Mar. 26, 2020

(30) Foreign Application Priority Data

Sep. 25, 2018   (JP) .............................. JP2018-179479

(51) Int. Cl.
*H03M 1/48* (2006.01)
*G05B 19/414* (2006.01)
*G05B 19/402* (2006.01)

(52) U.S. Cl.
CPC .......... *H03M 1/485* (2013.01); *G05B 19/402* (2013.01); *G05B 19/4145* (2013.01)

(58) Field of Classification Search
CPC .. G05B 19/27; G05B 19/402; G05B 19/4062; G05B 19/4145; G05B 2219/33123; G05B 2219/33157; G05B 2219/37104; G05B 2219/37175; G05B 2219/37177; H03M 1/485
See application file for complete search history.

(56) References Cited

U.S. PATENT DOCUMENTS

| 2004/0066165 A1* | 4/2004 | Kamio | ...... H02P 8/42 318/701 |
| 2015/0123589 A1* | 5/2015 | Matsutani | .......... G05B 23/0224 318/652 |
| 2016/0344429 A1* | 11/2016 | Ogawa | ............... G01D 5/24461 |

FOREIGN PATENT DOCUMENTS

| JP | 05-113809 A | 5/1993 |
| JP | 2007147465 A | 6/2007 |
| JP | 2016001103 A | 1/2016 |
| JP | 2016004013 A | 1/2016 |
| JP | 2007322301 A | 12/2017 |

* cited by examiner

*Primary Examiner* — Kidest Bahta
(74) *Attorney, Agent, or Firm* — RatnerPrestia

(57) ABSTRACT

A control system includes an encoder and a control device that controls a target object. The encoder includes a position information generating unit that generates position information made of a predetermined amount of data and including absolute position data of an object to be detected; a configuration information generating unit that generates configuration information representing a ratio of the absolute position data in the amount of data during serial communication; and a transmission unit that transmits, to the control device, the position information and the configuration information as serial data. The control device includes a reception unit that receives the position information and the configuration information transmitted from the encoder; a storage unit that stores the received configuration information; and a notification unit that performs notification of a configuration mismatch when the stored configuration information does not match the next received configuration information.

6 Claims, 13 Drawing Sheets

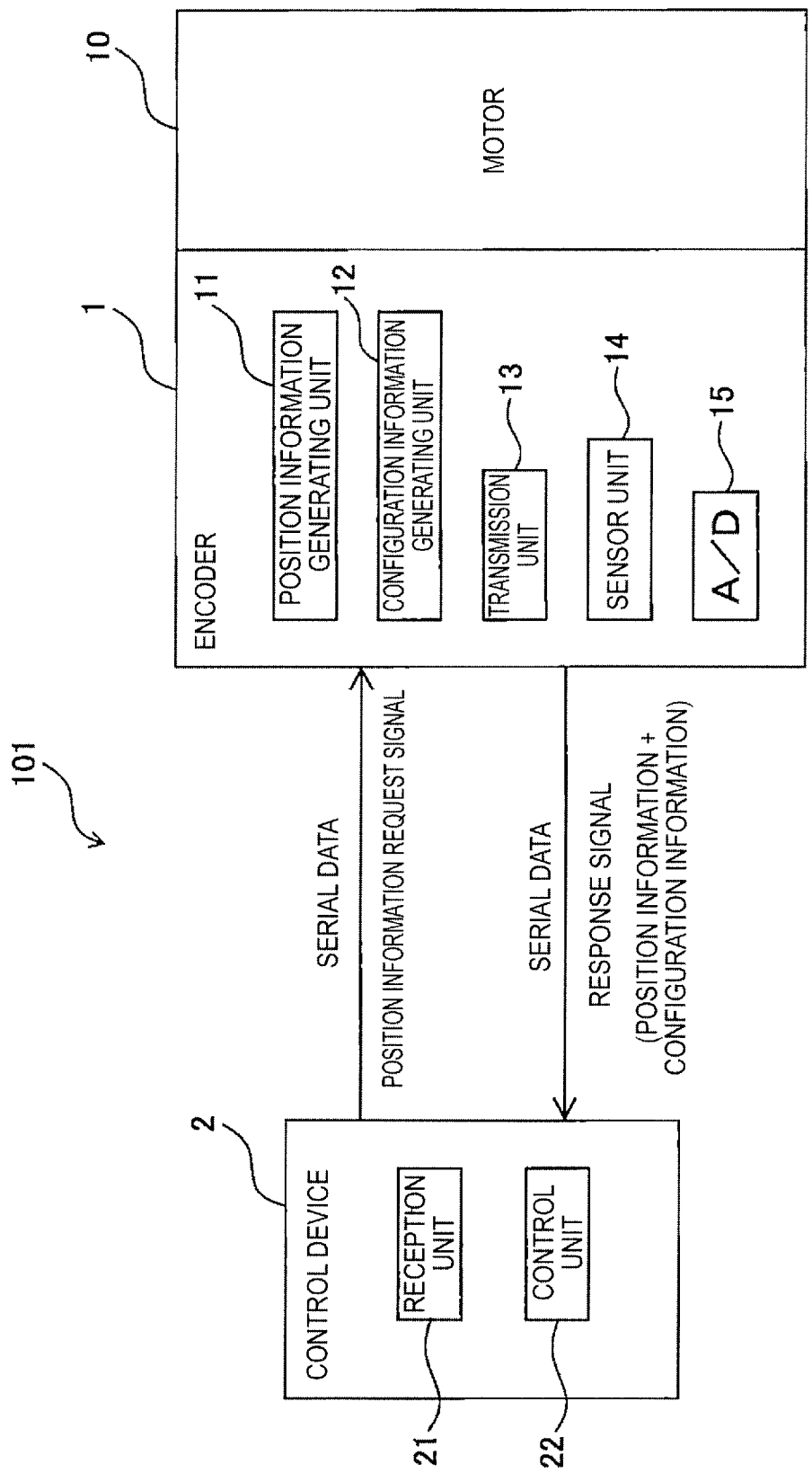

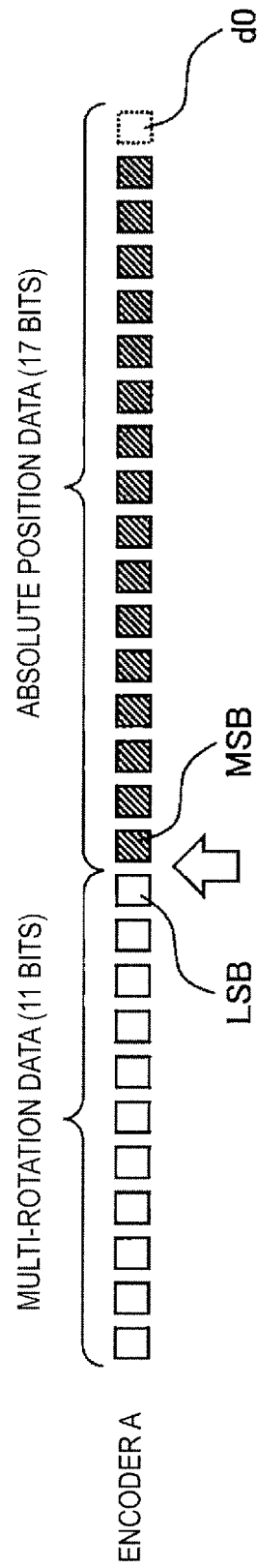

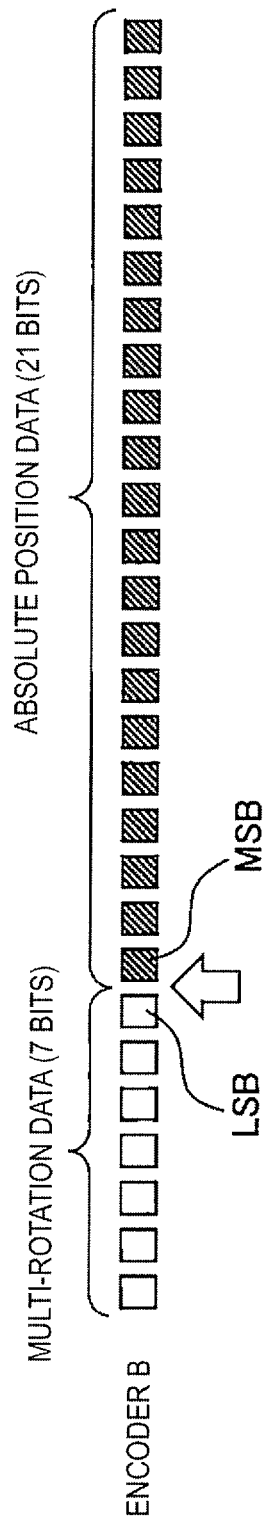

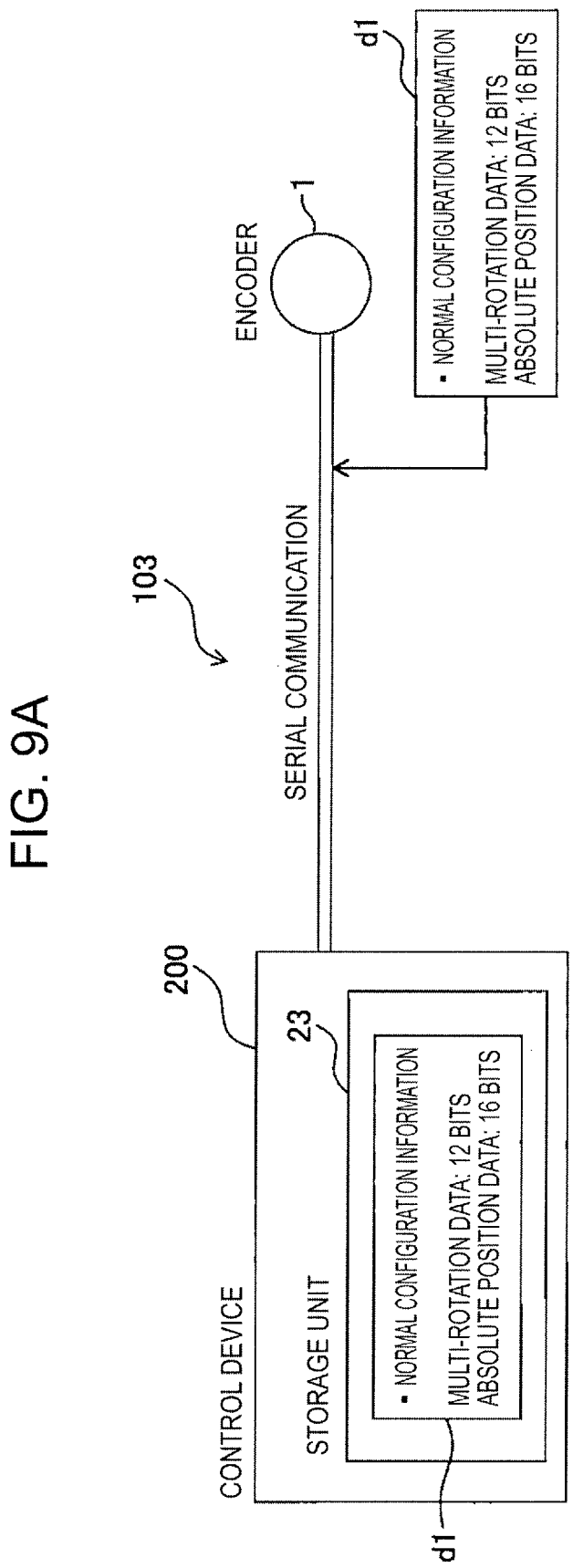

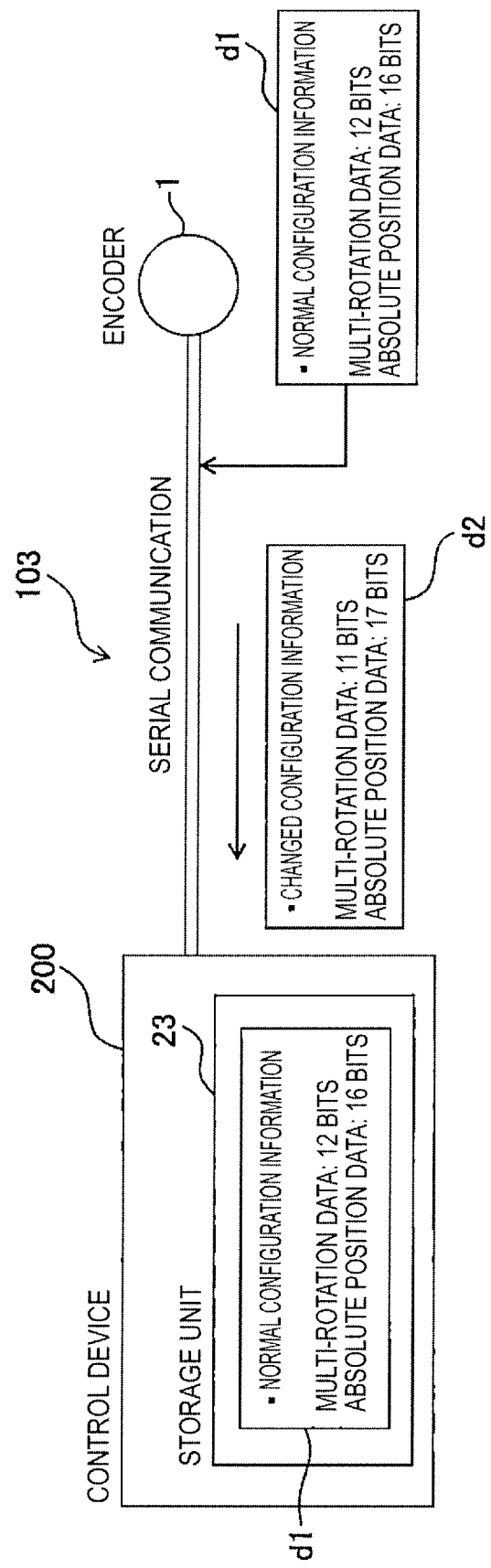

ENCODER AND CONTROL SYSTEM

CROSS-REFERENCE TO RELATED APPLICATIONS

This application is a new U.S. Patent Application that claims benefit of Japanese Patent Application No. 2018-179479, dated Sep. 25, 2018, the disclosure of this application is being incorporated herein by reference in its entirety for ail purposes.

BACKGROUND OF THE INVENTION

1. Field of the Invention

The present invention relates to an encoder and a control system.

2. Description of the Related Art

In a control system that includes an encoder that performs serial communication, the encoder receives a signal from a control device requesting position information and communicates the position information generated at a certain timing on serial data. Here, an amount of data of the position information held by the encoder, that is, an amount of multi-rotation data of an object to be detected and an amount of the position data within a single rotation, varies depending on the encoder. In particular, in a battery-less encoder that backs up the multi-rotation data representing a number of rotations of the object to be detected in the encoder alone, the amount of the multi-rotation data may vary depending on the battery-less method and the size of the encoder.

Thus, a serial interface method is reported, in which the type of data transfer format of the encoder being used can be automatically determined and processed by a CNC (a computer numerical control device)(JP 5-113809 A, for example).

However, in a case where the configuration of the amount of position data transmitted from the encoder is misread due to noise, part failure, or the like, or in a case where the encoder changes the configuration of the amount of position data as a result of the encoder being replaced, the weight of the position data changes, which raises a problem of affecting operation.

SUMMARY OF THE INVENTION

An object of the present invention is to provide an encoder and a control system that can avoid affecting an operation even when a configuration of an amount of position data transmitted from the encoder changes.

A control system according to an example of the present disclosure includes an encoder and a control device configured to control a target object by using information transmitted from the encoder by serial communication. The encoder includes a position information generating unit configured to generate position information made of a predetermined amount of data and including absolute position data of an object to be detected, a configuration information generating unit configured to generate configuration information representing a ratio of the absolute position data in the amount of data during serial communication, and a transmission unit configured to transmit, to the control device, the position information and the configuration information as serial data. The control device includes a reception unit configured to receive the position information and the configuration information transmitted from the encoder, a storage unit configured to store the configuration information received by the reception unit, and a notification unit configured to perform notification of a configuration mismatch when the configuration information stored in the storage unit does not match the configuration information received by the reception unit a next time.

According to the encoder and the control system according to the example of the present disclosure, even in a case where the configuration of the amount of position data transmitted from the encoder has changed, the effect on the operation can be avoided.

BRIEF DESCRIPTION OF THE DRAWINGS

FIG. 1 is a configuration diagram of a control system according to Example 1.

FIG. 2B is a diagram illustrating an example of position information of an encoder in the control system according to Example 1.

FIG. 2C is a diagram illustrating another example of position information of an encoder in the control system according to Example 1.

FIG. 9A is a diagram illustrating a state in which a control device stores configuration information initially transmitted from an encoder in the control system according to Example 3.

FIG. 9B is a diagram illustrating an example in which, in the control system according to Example 3, after storing of configuration information initially transmitted from an encoder, the configuration information transmitted a next time has changed.

DETAILED DESCRIPTION

Figure 2A:
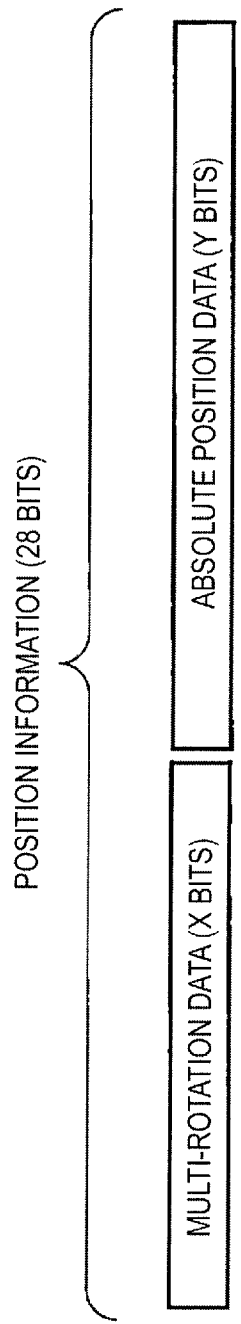
FIG. 2A is a diagram illustrating a configuration of position information of an encoder in the control system according to Example 1.

Hereinafter, an encoder and a control system according to the present invention are described with reference to the drawings. However, the technical scope of the invention is not limited to these embodiments and includes the invention described in the claims and elements equivalent thereto.

First, a control system according to Example 1 will be described. A configuration diagram of the control system according to Example 1 is illustrated in FIG. 1. A control system 101 according to Example 1 includes an encoder 1; and a control device 2 that controls a target object by using information transmitted by serial communication from the encoder 1.

The encoder 1 included in the control system 101 according to Example 1 includes a position information generating unit 11, a configuration information generating unit 12, a transmission unit 13, a sensor unit 14, and an analog-to-digital (A/D) converter 15. The encoder 1 is provided in the vicinity of a motor 10 that is an object to be detected and detects a position and a movement speed of a rotation shaft (not illustrated) of the motor 10.

The sensor unit 14 detects the movement of the rotation shaft of the motor 10 that is the object to be detected and outputs an analog signal corresponding to a movement distance of the rotation shaft. The A/D converter 15 performs A/D conversion on the analog signal output from the sensor unit 14 and outputs a digital signal.

The encoder 1 receives, from the control device 2, a position information request signal requesting the position information of the object to be detected.

The position information generating unit 11 generates position information that is made of a predetermined amount of data and that includes absolute position data of the object to be detected (the motor 10, for example). When the encoder 1 is a linear encoder, the position information is configured by the absolute position data. On the other hand, when the encoder 1 is a rotary encoder, the position information is configured by multi-rotation data and the absolute position data (position data within a single rotation). Here, the term "amount of data" refers to a total number of the number of bits representing the amount of the multi-rotation data and the number of bits representing the amount of the absolute position data, that is, the total number of bits. The amount of data is predetermined as a format of the serial communication between the encoder 1 and the control device 2.

FIG. 2A illustrates a configuration of the position information of the encoder in the control system according to Example 1. FIG. 2A illustrates an example in which the predetermined amount of data of the position information is 28 bits. The position information is configured by the multi-rotation data of X bits and the absolute position data of Y bits. In the example illustrated in FIG. 2A, the sum of X and Y is 28.

The configuration information generating unit 12 generates configuration information representing a ratio of the absolute position data in the amount of data during the serial communication. Here, the ratio is expressed by the distribution of the amount of the multi-rotation data and the amount of the absolute position data; or a position of a boundary between the different types of data; and the like. The configuration information includes information about the amount of the absolute position data. In the example illustrated in FIG. 2A, the configuration information can be expressed by the amount of the multi-rotation data (X bits), by the amount of the absolute position data (Y bits), or by both of the amounts of data in the predetermined amount of data (28 bits). For example, the configuration information can be represented by ($X=m$), by ($Y=n$), or by ($X=m, Y=n$) (where m and n are positive integers). In this case, the sum of m and n is the amount of data ($m+n$) of the position information. Since the amount of data ($m+n$) is known, when the amount ($X=m$) of the multi-rotation data is received as the configuration information, it is possible to calculate the amount of the absolute position data ($Y=m+n-X=n$), and when the amount ($Y=n$) of the absolute position data is received, it is possible to calculate the amount of the multi-rotation data ($X=m+n-Y=m$).

In this manner, the position information generating unit 11 generates the position information including the absolute position data and the multi-rotation data of the object to be detected, and the configuration information generating unit 12 generates the configuration information representing the distribution of the absolute position data and the multi-rotation data in the amount of data during the serial communication.

The transmission unit 13 of the encoder 1 transmits, to the control device 2, the position information corresponding to the configuration information, together with the configuration information. The position information generating unit 11 and the configuration information generating unit 12 of the encoder 1 can be realized by hardware, such as a circuit implementing the functions thereof, or can be realized by a computing device, such as a CPU, using software implementing functions equivalent thereto.

The control device 2 includes a reception unit 21 and a control unit 22.

The reception unit 21 receives the position information and the configuration information transmitted from the encoder 1. In the example illustrated in FIG. 1, the reception unit 21 of the control device 2 receives the position information and the configuration information transmitted by the transmission unit 13 of the encoder 1.

The control unit 22 processes the position information received by the reception unit 21 on the basis of the configuration information received by the reception unit 21.

Figure 3:
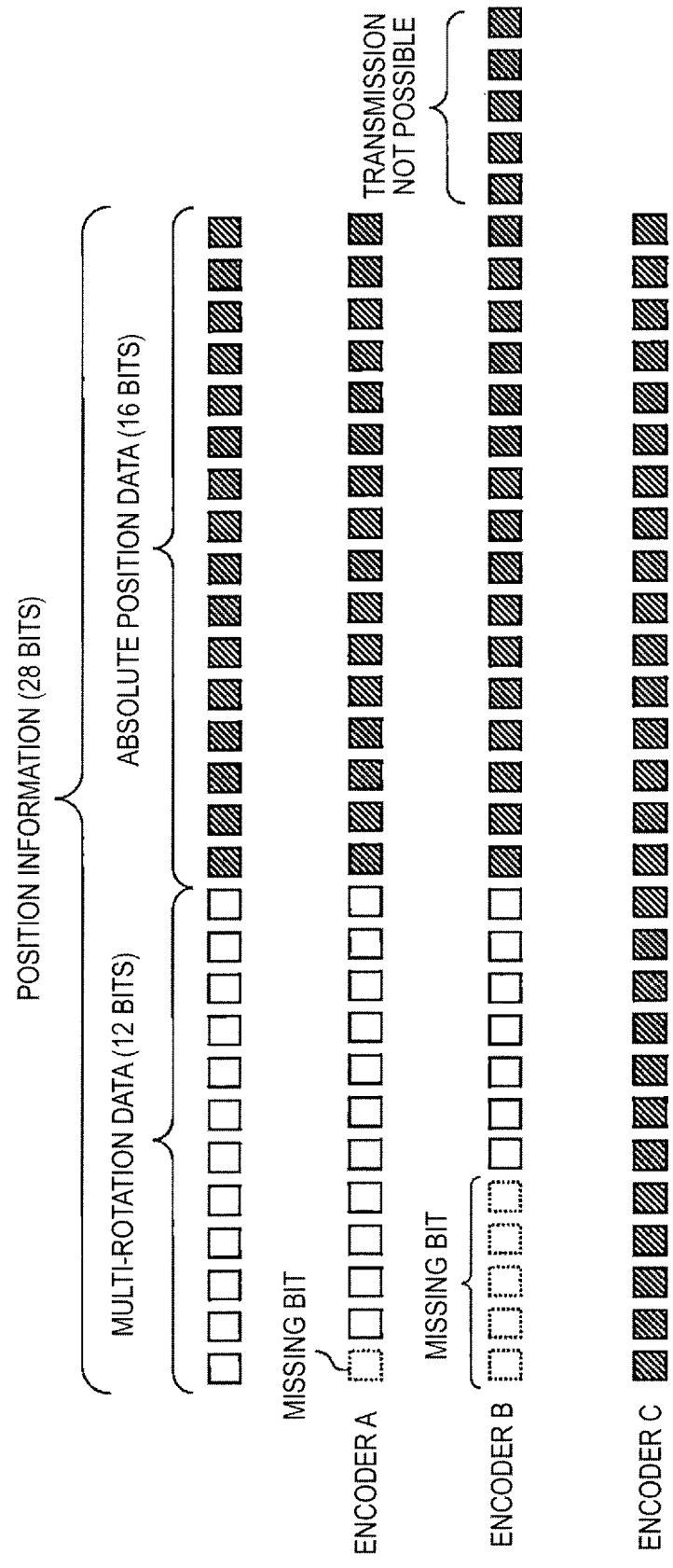
FIG. 3 is a diagram illustrating an example of position information of various types of encoders when a configuration of position information is fixed in a specific format.

Here, in order to explain a specific example of the configuration information, FIG. 3 illustrates an example of the position information in various encoders in a case in which the configuration of the position information is fixed in a specific format. As illustrated in FIG. 3, a format is given as an example of the serial communication in which the amount of the multi-rotation data is specified as 12 bits and the amount of the absolute position data is specified as 16 bits, of the position information of the predetermined amount of data (28 bits).

When each of the amounts of data is specified in the format of the communication, the encoder needs to fill the number of bits described above. However, in a battery-less encoder or the like, the amount of the multi-rotation data that can be output varies depending on the battery-less method and on the size of the encoder, and it may not be possible to fill the number of bits in the format.

As with an encoder A illustrated in FIG. 3, in a battery-less encoder in which the amount of the multi-rotation data is only 11 bits, the above-described format cannot be filled, and missing bits arise. If this is not addressed, a problem arises when the encoder has rotated by 12 bits (4096) or more. Therefore, processing is required to mask the most significant bit of the amount of the multi-rotation data, on the reception side of the position information. However, in a case where the amount of the multi-rotation data held by the encoder cannot be automatically determined, some parameter settings need to be performed manually.

In contrast, in the encoder 1 according to Example 1, of the position information in the format of the serial communication, the configuration information, which is the information by which the amounts of the multi-rotational data and the absolute position data held by the encoder 1 are ascertained, being transmitted using the serial communication from the encoder to the control device 2. As a result, it is possible to perform control using an optimum format for the encoder 1.

In other words, according to the encoder according to Example 1, in the case of the encoder A, by transmitting to the control device that, of the 28 bits of the position information, the amount of the multi-rotation data is 11 bits or the amount of the absolute position data is 17 bits; or transmitting both of these, the control device can determine the configuration of the position information transmitted by the encoder, and optimal control can be achieved without performing manual parameter setting. FIG. 2B illustrates an example of the position information of the encoder in the control system according to Example 1. According to the encoder according to Example 1, the configuration information generating unit 12 generates the configuration information (X=11, Y=17) in which the amount of the multi-rotation data of the encoder A is 11 bits and the amount of the absolute position data is 17 bits. In this case, a least significant bit d0 of the absolute position data is missing, and thus, for example, a value of 0 may be assigned. Since d0 is the least significant bit, it does not significantly affect the accuracy of the data.

In addition, as with an encoder B in FIG. 3, there may be a case in which, for the improvement in resolution, more of the absolute position data is output than the multi-rotation data. However, in a case where the amount of the absolute position data is determined to be 16 bits by the format of the serial communication, 5 bits of the lower-level absolute position data cannot be transmitted, and a problem arises in which the superiority of the high-resolution encoder is lost.

FIG. 2C illustrates another example of the configuration of the position information of the encoder in the encoder according to Example 1. As illustrated in FIG. 2C, in the encoder according to Example 1, in the case of the encoder B, it is possible to make use of the high resolution of the encoder B because the configuration information (X=7, Y=21) in which, of the 28 bits of the amount of data, the amount of the multi-rotation data is 7 bits and the amount of the absolute data is 21 bits, can be specified on the encoder side.

In addition, as with an encoder C in FIG. 3, in an encoder (primarily a linear encoder) that does not require the multi-rotation data, the multi-rotation data is not present, and it is thus necessary to transmit all the data as the absolute position data. However, there has been a problem in that optimum data cannot be transmitted when the presence of the multi-rotation data is specified as the configuration of the position information in the format of the serial communication.

Figure 2D:
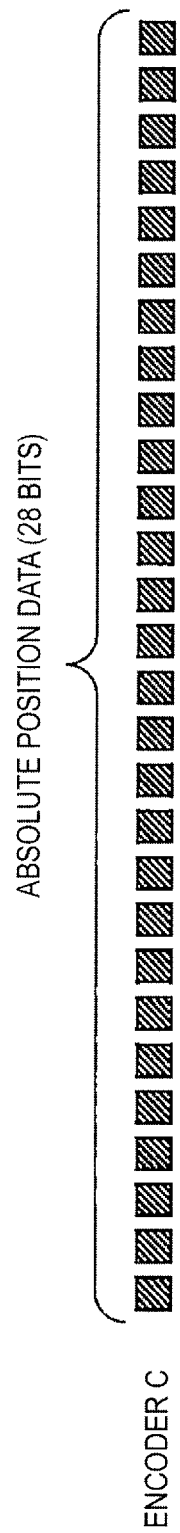
FIG. 2D is a diagram illustrating yet another example of position information of an encoder in the control system according to Example 1.

FIG. 2D illustrates yet another example of the configuration of the position information of the encoder in the encoder according to Example 1. As illustrated in FIG. 2D, in the encoder according to Example 1, in the case of the encoder C, the transmission of the optimum data can be performed because the configuration information (X=0, Y=28), in which, of the 28 bits of the amount of data, the amount of the multi-rotation data is 0 bits and the amount of the absolute position data is 28 bits, can be specified on the encoder side.

In the above description, as an example of the configuration information, the information is given indicating the distribution in which the amount of the multi-rotation data is 12 bits and the amount of the absolute position data is 16 bits, of the amount of data of the predetermined amount of data (28 bits) (e.g. X=12, Y=16). However, the configuration information is not limited to such an example, and the configuration information may include information indicating a boundary between the absolute position data and the multi-rotation data during the serial communication. Specifically, the configuration information includes information representing the position of the least significant bit (LSB) of the multi-rotation data or of the absolute position data; the position of the most significant bit (MSB) of the multi-rotation data or of the absolute position data; or both the position of the least significant bit (LSB) and the position of the most significant bit (MSB), the positions being adjacent to the boundary between the multi-rotation data and the absolute position data in the position information. For example, in the case of the encoder A in FIG. 2B, this may be information indicating that the boundary between the multi-rotation data and the absolute position data is between an 11th bit that is the least significant bit of the multi-rotation data and a 12th bit that is the most significant bit of the absolute position data, as indicated by an arrow.

Figure 4:
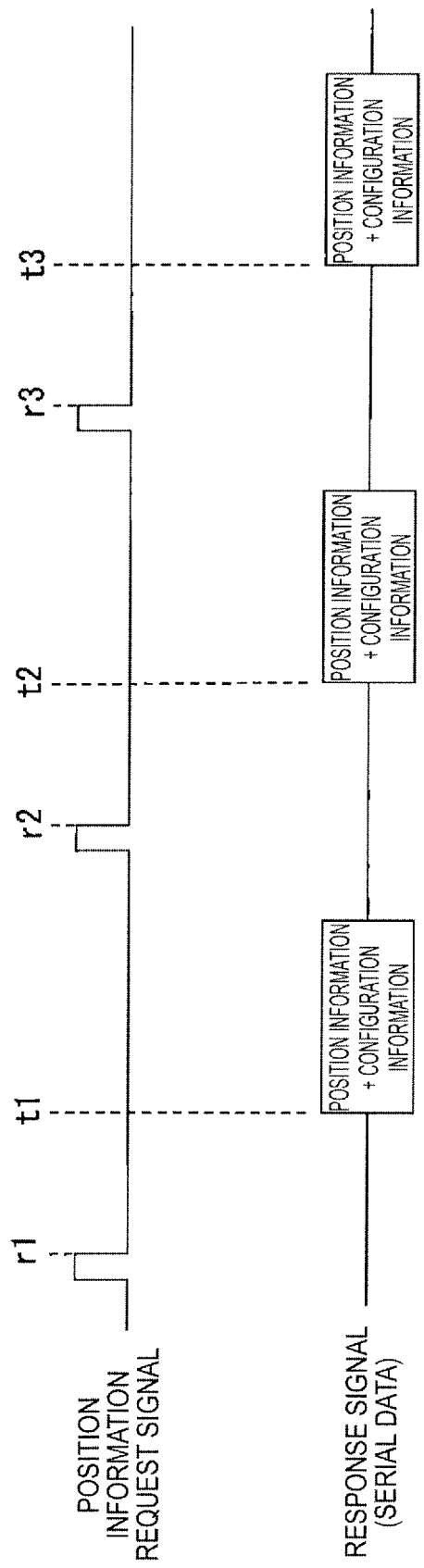
FIG. 4 is a timing chart of a position information request signal transmitted by a control device and of a response signal transmitted by an encoder in the control system according to Example 1.

The serial communication between the encoder 1 and the control device 2 will now be described. The control device 2 transmits the signal for requesting the position information (the position information request signal) to the encoder 1 at a predetermined cycle. The encoder 1 transmits the position information and the configuration information as serial data to the control device 2 each time the encoder 1 receives the request signal from the control device 2. The configuration information preferably includes the information about the amount of the absolute position data or of the multi-rotation data. FIG. 4 is a timing chart of the position information request signal transmitted by the control device and of a response signal transmitted by the encoder in the control system according to Example 1. For example, a time at which the encoder 1 receives the position information request signal is referred to as times r1, r2, and r3 of a trailing edge of a pulse of the position information request signal.

The position information generating unit 11 generates the position information after a predetermined period of time from receiving the position information request signal. In the example illustrated in FIG. 1, the position information generating unit 11 generates the position information of the object to be detected on the basis of the digital signal output from the A/D converter 15. The position information includes the multi-rotation data of the X bits and the absolute position data of the Y bits.

The configuration information generating unit 12 generates the configuration information (X=m, Y=n) representing the amount of the multi-rotation data (X=m), the amount of the absolute position data (Y=n), or both. The configuration information preferably includes the information about the amount of the absolute position data. However, in a case where the amount of data (m+n) is already known, the amount (Y=n) of the absolute position data can be calculated from the amount (X=m) of the multi-rotation data.

The transmission unit 13 transmits the position information and the configuration information as a series of serial data to the control device 2. In FIG. 4, for example, when the encoder 1 receives a first position information request signal at the time r1, the transmission unit 13 transmits the position information and the configuration information as a series of serial data to the control device 2 at a time t1 after the predetermined period of time. Similarly, when the encoder 1 receives a second position information request signal at the time r2, the transmission unit 13 transmits the position information and the configuration information as a series of serial data to the control device 2 at a time t2 after the predetermined period of time. Similarly, when the encoder 1 receives a third position information request signal at the time r3, the transmission unit 13 transmits the position information and the configuration information to the control device 2 as a series of serial data at a time t3 after the predetermined period of time.

As described above, by transmitting both the position information and the configuration information each time the position information request signal is received, the encoder 1 can transmit the correct position information even in a case where the configuration information is changed. Examples of cases in which the configuration information is changed include a case in which the configuration of the position information is changed in accordance with the size of the position information, a case in which the encoder is changed, and the like.

According to the control system according to Example 1, by transmitting, to the control device, the configuration information representing the distribution of the amount of the multi-rotation data and the amount of absolute position data in the position data of the serial data from the encoder, the communication of the position data in an optimal format for the encoder is possible.

Figure 5:
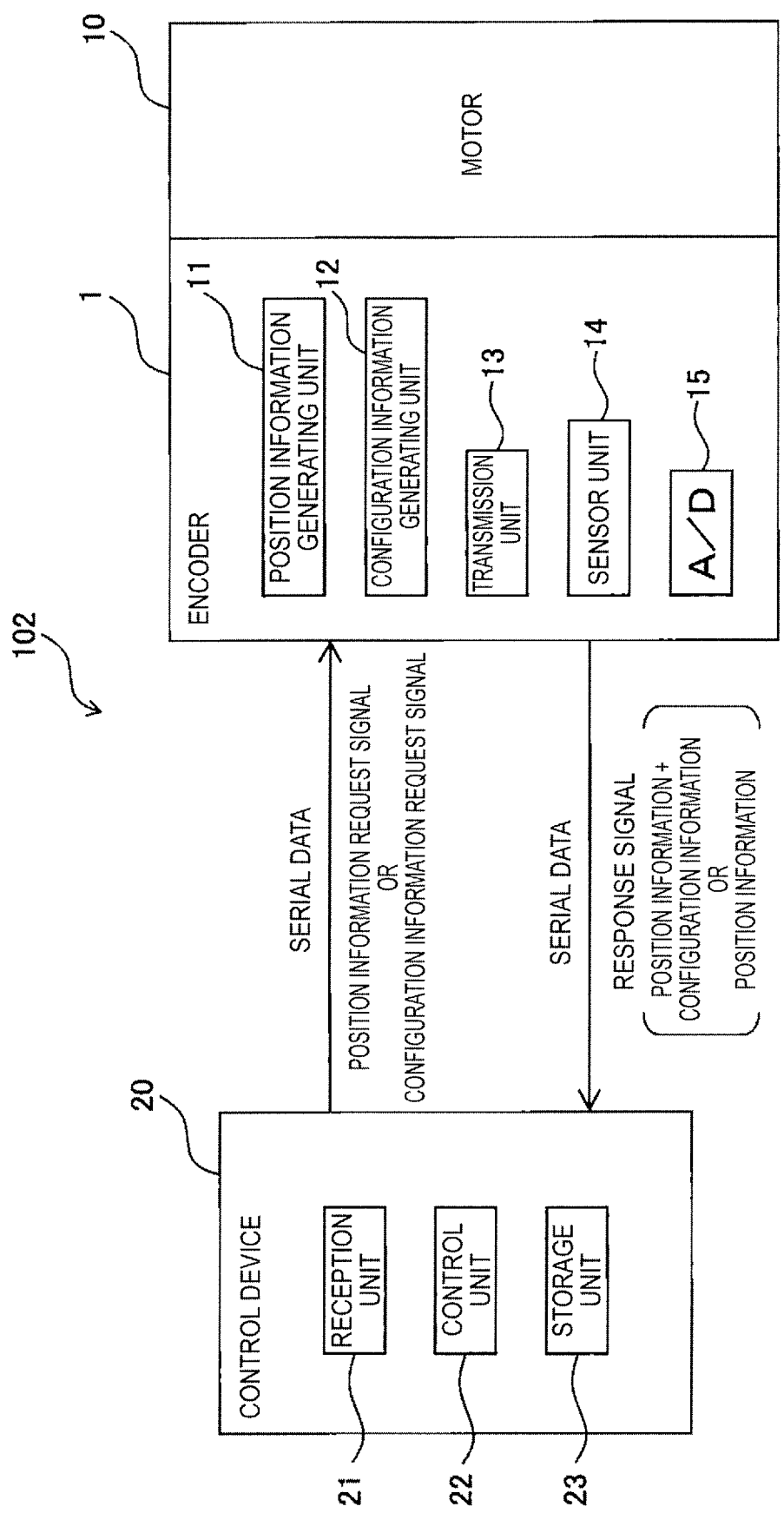
FIG. 5 is a configuration diagram of a control system according to Example 2.

A control system according to Example 2 will now be described. FIG. 5 illustrates a configuration diagram of the control system according to Example 2. A control system 102 according to Example 2 is different from the control system 101 according to Example 1 in that the transmission unit 13 sends the position information and the configuration information to a control device 20 as a series of serial data or as separate serial data, in that the control system 2 further includes a storage unit 23 that stores the configuration information received by the reception unit 21, and in that the control unit 22 processes the position information received by the reception unit 21 on the basis of the configuration information stored in the storage unit 23. Since the rest of the configuration of the control system 102 according to Example 2 is similar to that of the control system 101 according to Example 1, a detailed description thereof is omitted.

The transmission unit 13 of the encoder 1 transmits, to the control device 20, the position information corresponding to the configuration information. The configuration information preferably includes the information about the amount of the absolute position data.

The position information generating unit 11 generates the position information including the absolute position data and the multi-rotation data of the object to be detected. The configuration information generating unit 12 generates the configuration information representing the distribution of the absolute position data and the multi-rotation data in the amount of data during the serial communication. The configuration information preferably includes the information about the amount of the absolute position data or of the multi-rotation data.

The transmission unit 13 transmits, to the control device 20, the position information corresponding to the configuration information.

The reception unit 21 of the control device 20 receives the position information and the configuration information transmitted from the encoder. The storage unit 23 of the control device 20 stores the configuration information received by the reception unit 21. The control unit 22 of the control device 20 processes the position information received by the reception unit 21, on the basis of the configuration information stored in the storage unit 23. By storing the configuration information transmitted from the encoder 1 in the storage unit 23 on the control device 20 side, the encoder 1 does not need to constantly transmit the configuration information along with the position information.

Figure 6:
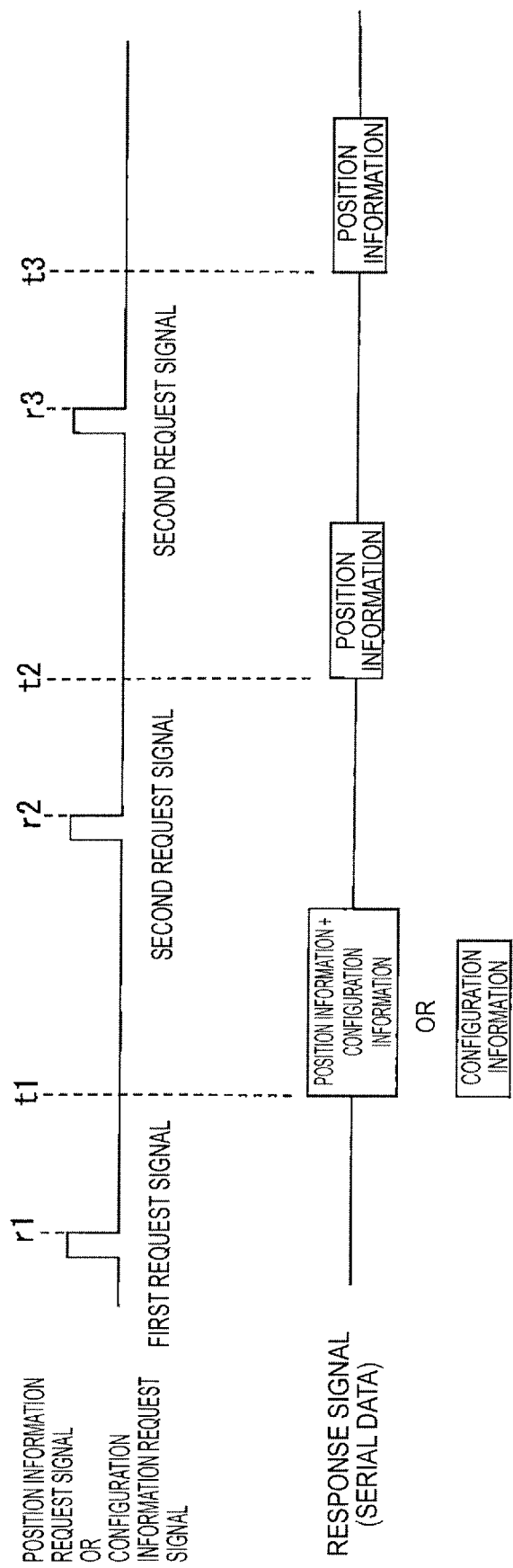
FIG. 6 is a timing chart of a position information request signal or a configuration information request signal transmitted by a control device and of a response signal transmitted by an encoder in the control system according to Example 2.

The position information and the configuration information transmitted and received in the control system according to Example 2 will now be described. FIG. 6 illustrates a timing chart of the position information request signal or a configuration information request signal transmitted by the control device and of the response signal transmitted by the encoder in the control system according to Example 2.

For example, the time at which the control device 20 transmits the position information request signal is referred to as the times r1, r2, and r3 of the trailing edge of the pulse of the position information request signal.

The position information generating unit 11 generates the position information after a predetermined period of time after receiving the position information request signal. In the example illustrated in FIG. 5, the position information generating unit 11 generates the position information of the object to be detected on the basis of the digital signal output from the A/D converter 15. The position information includes the multi-rotation data of the X bits and the absolute position data of the Y bits.

The configuration information generating unit 12 generates the configuration information (X=m, Y=n) representing the amount of the multi-rotation data (X=m bits), the amount of the absolute position data (Y=n bits), or both. The configuration information preferably includes the information about the amount of the absolute position data. However, in a case where the amount of data (m+n) is already known, the amount (Y=n) of the absolute position data can be calculated from the amount (X=m) of the multi-rotation data.

The configuration information may include the information indicating the boundary between the absolute position data and the multi-rotation data during the serial communication. Specifically, the configuration information includes information representing the position of the least significant bit (LSB) of the multi-rotation data or of the absolute position data; the position of the most significant bit (MSB) of the multi-rotation data or of the absolute position data; or both the position of the least significant bit (LSB) and the position of the most significant bit (MSB), the positions being adjacent to the boundary between the multi-rotation data and the absolute position data in the position information.

The control device 20 transmits a first request signal for the position information or the configuration information to the encoder 1 at the start of the serial communication. Here, the "first request signal" is a signal for requesting the position information or the configuration information that the control device 20 transmits to the encoder 1 at the start of the serial communication. In FIG. 6, for example, the encoder 1 receives the first request signal for requesting the position information or the configuration information at the time r1, which is the start of the serial communication.

When the encoder 1 receives the first request signal from the control device 20, the encoder 1 transmits the configuration information along with the position information to the control device 20 as a series of serial data or transmits the configuration information as separate serial data to the control device. In FIG. 6, at the time t1, the transmission unit 13 transmits the configuration information along with the position information to the control device 20 as a series of serial data using serial communication. Alternatively, the configuration information may be transmitted as separate serial data to the control device.

The storage unit 23 of the control device 20 stores the configuration information received from the encoder 1. Accordingly, the configuration of the multi-rotation data and the absolute position data in the position information received from the second time onward can be determined on the basis of the configuration information stored in the storage unit 23.

The encoder 1 may transmit, to the control device 20, specification information relating to an encoder specification along with the configuration information when the encoder 1 receives the first request signal from the control device 20. The encoder specification information preferably includes at least one of information related to an encoder drawing number, a model, a serial number, and the like. By transmitting the encoder specification information, it is possible to check, on the control device side, whether the encoder has been changed.

The control device transmits a second request signal for the position information to the encoder at a predetermined cycle after transmitting the first request signal. Here, the "second request signal" is a signal for requesting the position information that is transmitted to the encoder 1 at the predetermined cycle after the control device 20 transmits the first request signal to the encoder 1. As illustrated in FIG. 6, at the time r2, the encoder 1 receives the second request signal for the position information as the request signal transmitted the second time.

The encoder 1 transmits the position information as separate serial data to the control device 20 each time (t=t2, t3, . . . ) the encoder 1 receives the second request signal from the control device 20. As illustrated in FIG. 6, at the time t2, the transmission unit 13 transmits the position information as separate serial data to the control device 20. Following that, in a similar manner, each time the encoder 1 receives the second request signal, as a third request signal onward, from the control device 20 after the time t3, the encoder 1 transmits the position information as separate serial data to the control device 20.

In this way, in the control system according to Example 2, when the encoder receives the first position information request signal, the configuration information is transmitted to the control device only once, and the configuration information received by the control device is stored. With such a configuration, the encoder can transmit the configuration information only once, can transmit only the position information from the second time onward, and is thus able to provide a margin in the serial data transmitted by the encoder.

In the above description, an example is given in which the encoder transmits the configuration information only once after receiving the position information request signal, but the present invention is not limited to such an example. For example, by transmitting the configuration information periodically, it is possible to confirm that there is no change in the configuration of the position information. Further, when the configuration of the position information of the encoder is changed, the configuration information may be transmitted each time the position information is changed. An example of a case in which the configuration information is changed includes a case in which the configuration of the position information is changed in accordance with the size of the position information; or a case in which the encoder is changed.

Figure 7:
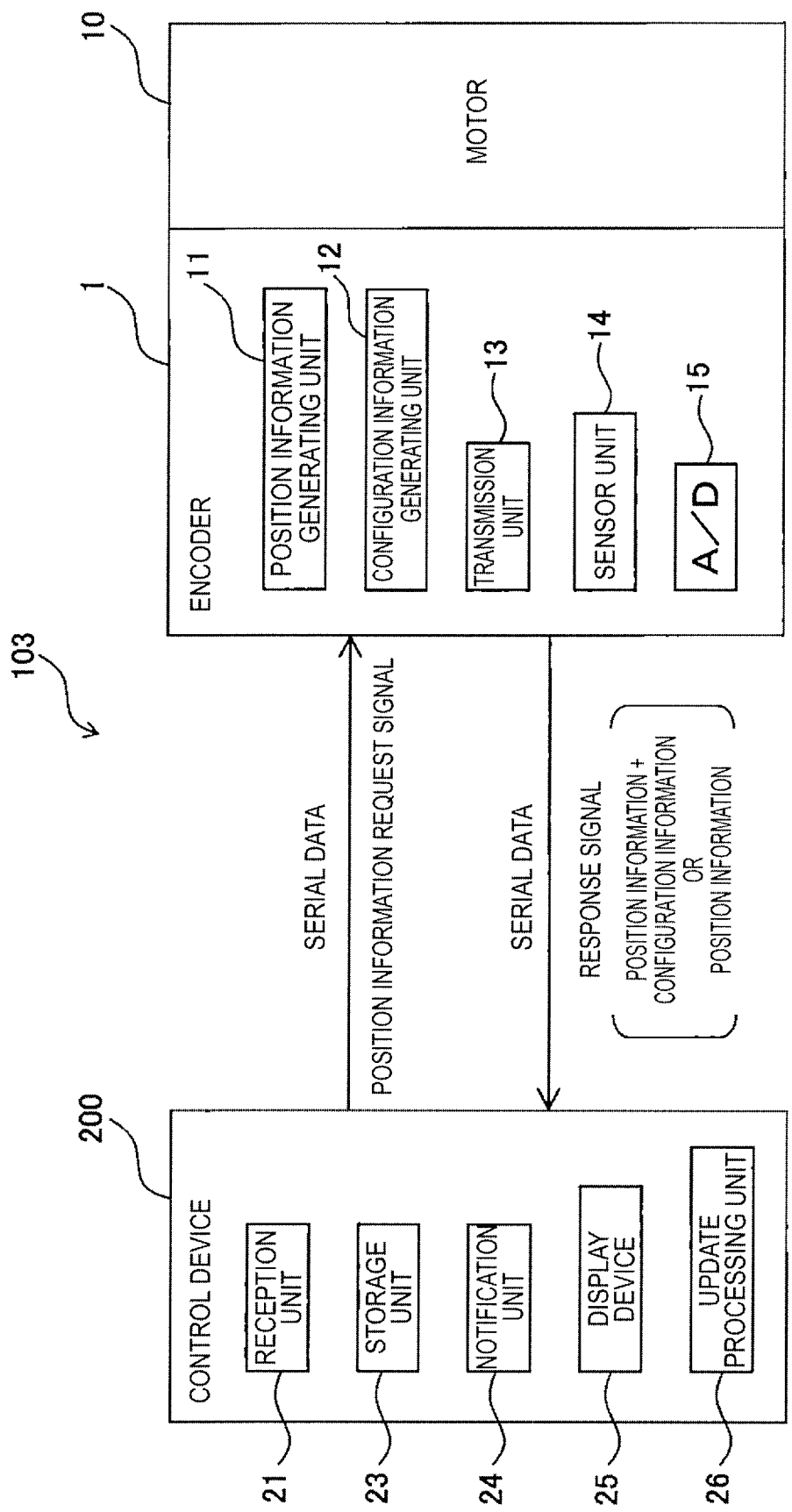
FIG. 7 is a configuration diagram of a control system according to Example 3.

A control system according to Example 3 will now be described. FIG. 7 illustrates a configuration diagram of a control system according to Example 3. A control system 103 according to Example 3 is provided with the encoder 1 and a control device 200 that controls a target object by using information transmitted by serial communication from the encoder 1.

The encoder 1 of the control system 103 according to Example 3 has the same configuration as the encoder 1 in the control system 101 according to Example 1.

The position information generating unit 11 of the encoder 1 generates the position information including the absolute position data and the multi-rotation data of the object to be detected. The configuration information generating unit 12 of the encoder 1 generates the configuration information representing the distribution of the absolute position data and the multi-rotation data in the amount of data during the serial communication. The transmission unit 13 transmits the position information corresponding to the configuration information to the control device 200.

The control device 200 in the control system 103 according to Example 3 includes the reception unit 21, the storage unit 23, and a notification unit 24.

The reception unit 21 receives the position information and the configuration information transmitted from the encoder 1. The storage unit 23 stores the configuration information received from the encoder 1 by the reception unit 21. The notification unit 24 performs the notification of a configuration mismatch when the configuration information stored in the storage unit 23 does not match the configuration information received by the reception unit 21 the next time.

Figure 8:
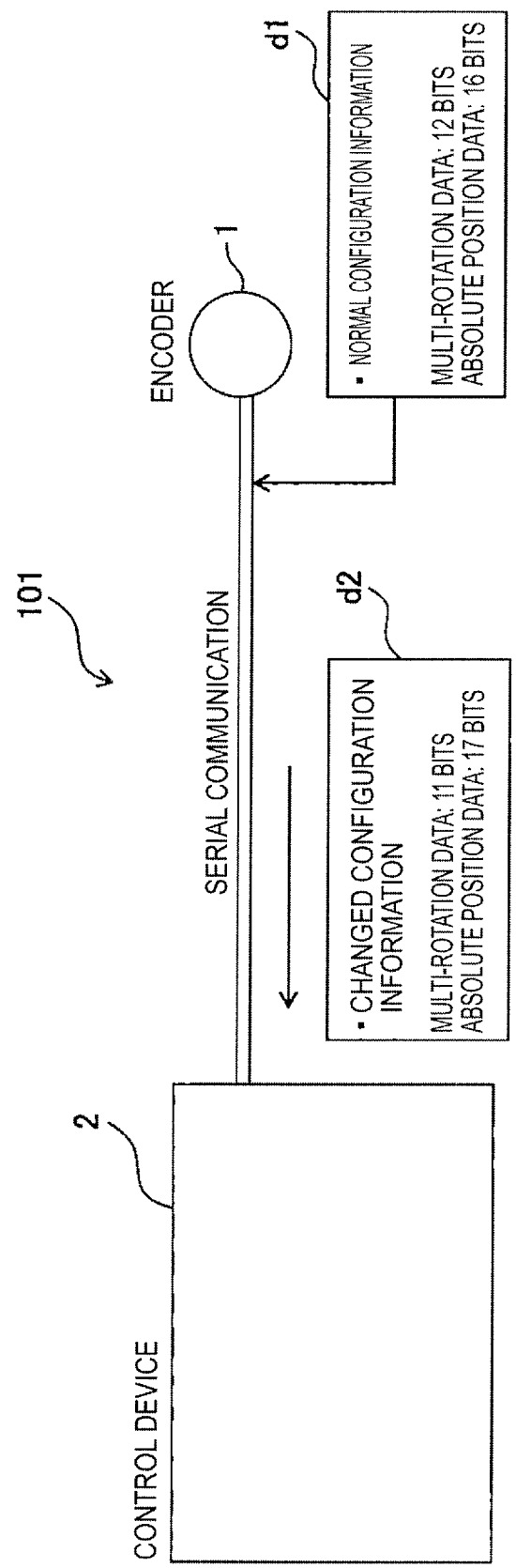
FIG. 8 is a diagram illustrating an example in which configuration information transmitted from an encoder changes in the control system according to Example 1.

In the control system according to Example 3, a procedure will now be described in which a warning or the like is issued when the control device 200 receives configuration information that is different from the configuration information stored in the storage unit. First, a case will now be described in which the configuration information transmitted from the encoder 1 changes to configuration information that is different from the configuration information received by the control device 200 in the past. FIG. 8 illustrates an example in which the configuration information transmitted from the encoder changes in the control system 101 according to Example 1. In FIG. 8, it is assumed that normal configuration information d1 transmitted by the encoder 1 is information indicating that the multi-rotation data is 12 bits and the absolute position data is 16 bits. At this time, the configuration information may be abnormal due to noise, a component failure, and the like, or the configuration information may change as a result of the encoder being replaced. For example, as illustrated in FIG. 8, it is assumed that the configuration information d1 has changed, on the serial communication circuit, to configuration information d2 indicating that the multi-rotation data is 11 bits and the absolute position data is 17 bits.

In the control system according to Example 1, the control device 2 is not provided with the storage unit and therefore cannot recognize changes in the configuration information, and the configuration information d2 that has changed from the normal configuration information is used as it is. As a result, since the weight of the position data (the distribution of the multi-rotation data and the absolute position data) changes, the control is executed on the basis of the erroneous position information.

In contrast, in the control system 103 according to Example 3, first, the storage unit 23 stores the normal configuration information received from the encoder 1. FIG. 9A illustrates a state in which the control device 200 stores the normal configuration information initially transmitted from the encoder in the control system according to Example 3. It is assumed that the normal configuration information d1 in the response signal transmitted by the encoder 1 is the information indicating that the multi-rotation data is 12 bits and the absolute position data is 16 bits. The storage unit 23 stores this normal configuration information d1.

FIG. 9B illustrates an example in which, after the storing of the configuration information initially transmitted from the encoder in the control system according to Example 3, the next transmitted configuration information has changed. For example, on the serial communication circuit, it is assumed that the normal configuration information d1 has changed to the configuration information d2 indicating that the multi-rotation data is 11 bits and the absolute position data is 17 bits. Examples of cases in which the configuration information is transmitted multiple times include cases in which the encoder has been changed, the control system has been reactivated, the configuration information has been transmitted multiple times to confirm that the configuration information has not been changed, etc.

The notification unit 24 performs the notification of the configuration mismatch when the normal configuration information (X=12, Y=16) stored in the storage unit 23 does not match the configuration information (X=11, Y=17) received by the reception unit 21 the next time. The control device 200 may stop controlling the target object (the motor 10, for example) to be controlled by the control device 200 when the notification unit 24 performs the notification of the configuration mismatch.

In this way, according to the control system according to Example 3, by storing the configuration information of the encoder 1 (the configuration of the position data) in the control device 200, a comparison can be made with the configuration information that has been transmitted again, and when a change is found, an operation abnormality can be prevented by generating warning information; or by stopping the processing of the position information in conjunction with generating the warning information. In addition, also in a case in which the configuration information is misread, the operation abnormality can be prevented by generating the warning information; or by stopping the processing of the position information in conjunction with generating the warning information. Further, it is possible to check whether the encoder has been replaced using the fact that the configuration information has changed.

The control device 200 may further include a display device 25 that displays the configuration mismatch as visual information. In a case in which the notification unit 24 generates the warning information or generates a command to stop the processing of the position information, the notification unit 24 may display, on the display device 25, the possibility that the encoder may have been replaced with another encoder. By performing such display, a user can easily recognize the possibility that the encoder may have been replaced.

Further, the transmission unit 13 of the encoder 1 may transmit the encoder specification information together with transmitting the configuration information. The encoder specification information preferably includes at least one of information related to the encoder drawing number, the model, the serial number, and the like. Further, the transmission unit 13 may transmit the encoder specification information when the control device 200 transmits a signal requesting the encoder specification information. By transmitting the encoder specification information, it is possible to check, on the control device side, whether the encoder has been changed.

The control device 200 may further include an update processing unit 26 that overwrites the configuration information stored in the storage unit 23 with the configuration information received by the reception unit 21 the next time. With such a configuration, the position information can be processed by using the configuration information of a new encoder after the encoder has been replaced with the new encoder.

The control unit 22, the notification unit 24, and the update processing unit 26 provided in the control device 200 can be realized by hardware, such as a circuit implementing the functions thereof, or can be realized by a computing device, such as a CPU, using software implementing functions equivalent thereto.

The invention claimed is:

1. A control system comprising:
an encoder; and
a control device configured to control a target object by using information transmitted from the encoder by serial communication, wherein
the encoder is configured to:
  generate position information made of a predetermined amount of data and including absolute position data of an object to be detected,
  generate configuration information representing a ratio of the absolute position data in the amount of data during serial communication, and
  transmit, to the control device, the position information and the configuration information as serial data, and
the control device is configured to:
  receive the position information and the configuration information transmitted from the encoder,
  store the configuration information received by the control device, and
  perform notification of a configuration mismatch when the configuration information stored in the control device does not match the configuration information received by the control device a next time.

2. The control system of claim 1, wherein
the control device is further configured to control of the target object when the control device performs the notification of the configuration mismatch.

3. The control system of claim 1,
wherein the control device is further configured to display the configuration mismatch as visual information.

4. The control system of claim 1, wherein
the control device is further configured to overwrite the configuration information stored with the configuration information received by the control device the next time.

5. The control system of claim 1, wherein
the encoder is further configured to:
  generate the position information including the absolute position data and multi-rotation data of the object to be detected, and
  generate the configuration information representing a distribution of the absolute position data and the multi-rotation data in the amount of data during the serial communication.

6. The control system of claim 1, wherein
the encoder is further configured to transmit, to the control device, the position information corresponding to the configuration information.

* * * * *